United States Patent
Hol et al.

(10) Patent No.: US 8,687,171 B2
(45) Date of Patent: Apr. 1, 2014

(54) ELECTROMAGNETIC ACTUATOR, STAGE APPARATUS AND LITHOGRAPHIC APPARATUS

(75) Inventors: Sven Antoin Johan Hol, Eindhoven (NL); Jan Van Eijk, Eindhoven (NL); Johannes Petrus Martinus Bernardus Vermeulen, Helmond (NL); Gerard Johannes Pieter Nijsse, Bodegraven (NL); Simon Bernardus Cornelis Maria Martens, Waalre (NL); Yang-Shan Huang, Veldhoven (NL); Michael Wilhelmus Theodorus Koot, Eindhoven (NL); Jeroen De Boeij, Eindhoven (NL); Maarten Hartger Kimman, Veldhoven (NL); Wei Zhou, Enschede (NL)

(73) Assignee: ASML Netherlands B.V., Veldhoven (NE)

( * ) Notice: Subject to any disclaimer, the term of this patent is extended or adjusted under 35 U.S.C. 154(b) by 38 days.

(21) Appl. No.: 13/401,560

(22) Filed: Feb. 21, 2012

(65) Prior Publication Data

US 2012/0212723 A1  Aug. 23, 2012

Related U.S. Application Data

(60) Provisional application No. 61/445,436, filed on Feb. 22, 2011.

(51) Int. Cl.
*G03B 27/58* (2006.01)
*G03B 27/62* (2006.01)
*H02K 41/02* (2006.01)

(52) U.S. Cl.
USPC .................................. 355/72; 355/75; 310/12

(58) Field of Classification Search
USPC .............. 355/53, 72–76; 310/10, 12; 318/115, 318/135; 335/278
See application file for complete search history.

(56) References Cited

U.S. PATENT DOCUMENTS

| 4,995,744 | A | * | 2/1991 | Goldowsky et al. | ........ 400/157.2 |
| 6,859,122 | B2 | * | 2/2005 | Divoux et al. | ................... 335/78 |
| 7,471,373 | B2 | | 12/2008 | Bartray et al. | |

(Continued)

FOREIGN PATENT DOCUMENTS

| DE | 60 2005 002 604 | 6/2008 |
| EP | 2 200 055 | 6/2010 |

(Continued)

OTHER PUBLICATIONS

Japanese Office Action mailed May 21, 2013 in corresponding Japanese Patent Application No. 2012-030538.

*Primary Examiner* — Hung Henry Nguyen
(74) *Attorney, Agent, or Firm* — Pillsbury Winthrop Shaw Pittman LLP (57) ABSTRACT

An electromagnetic actuator includes a first and second magnetic members that are displaceable relative to each other and are arranged to provide a magnetic circuit; and a coil configured to, in use, receive a current to generate a magnetic flux through the magnetic circuit, thereby generating a force between the first and second magnetic members in a first direction, the magnetic flux, in use, being transferred between the first and second magnetic members through a first surface of the first magnetic member and a second surface of the second magnetic member, the first and second surface being separated by an airgap, wherein the first surface and the second surface are arranged relative to each other such that an outer dimension of the first surface extends beyond an outer dimension of the second surface in a second direction substantially perpendicular to the first direction.

15 Claims, 7 Drawing Sheets

(56) References Cited

U.S. PATENT DOCUMENTS

| | | |
|---|---|---|
| 7,683,506 B2 * | 3/2010 | Watson .................... 310/12.01 |
| 2003/0034695 A1 | 2/2003 | Binnard et al. |
| 2005/0017831 A1 | 1/2005 | Ito |
| 2007/0025047 A1 | 2/2007 | Maerky |
| 2008/0296983 A1 | 12/2008 | Watson |
| 2010/0271611 A1 | 10/2010 | Van Der Pasch et al. |
| 2011/0069293 A1 | 3/2011 | Hol et al. |
| 2012/0019794 A1 | 1/2012 | Hol et al. |

FOREIGN PATENT DOCUMENTS

| | | |
|---|---|---|
| JP | 2002-367893 | 12/2002 |
| JP | 2005-243751 | 9/2005 |
| JP | 2006-304470 | 11/2006 |
| JP | 2009-087371 | 4/2009 |
| JP | 2012-019213 | 1/2012 |

* cited by examiner

FIG 1

PRIOR ART

Figure 2

PRIOR ART

ELECTROMAGNETIC ACTUATOR, STAGE APPARATUS AND LITHOGRAPHIC APPARATUS

CROSS REFERENCE TO RELATED APPLICATIONS

This application claims priority and benefit under 35 U.S.C. §119(e) to U.S. Provisional Patent Application No. 61/445,436, entitled "Electromagnetic Actuator, Stage Apparatus and Lithographic Apparatus," filed on Feb. 22, 2011. The content of that application is incorporated herein in its entirety by reference.

FIELD

The present invention relates to an electromagnetic actuator, a stage apparatus and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to accurately control the position of the patterning device relative to the wafer or substrate, a lithographic apparatus is often provided with one or more positioning devices for positioning an object table e.g. holding a patterning device or a substrate. Such positioning devices can e.g. comprise one or more linear actuators such as Lorentz actuators for accurate (short stroke) positioning of an object table or support. In such case, a first member of such Lorentz actuator (comprising one or more permanent magnets and optionally a magnetic yoke) is mounted to the object table or support that needs positioning whereas a second member of the actuator (comprising a coil for generating a magnetic flux and optionally a magnetic yoke) is mounted to a long-stroke mover. Such an actuator is configured to generate a force between the first and second member that is solely dependent on the current supplied to the coil and as such is independent of the position of the first member relative to the second member. Using a Lorentz actuator, such a force characteristic can be approximated within a specified operating range of the actuator.

In a lithographic apparatus, both accurate positioning and throughput (e.g. expressed as the number of wafers that can be processed per hour) can be considered equally important. In order to obtain a high throughput, powerful actuators and motors are required enabling high accelerations and decelerations of the object table thereby reducing any idle time between consecutive exposures. In order to meet these requirements, it is observed that known Lorentz actuators are found to have a comparatively small force density or force vs. dissipation, compared to other types of actuators such as variable reluctance actuators. It has been observed that a first member of such Lorentz actuator (comprising one or more permanent magnets and optionally a magnetic yoke) has a comparatively large volume and mass resulting in a comparatively high total mass to be displaced by the linear actuators of the positioning device. Further, such actuators are found to have a comparatively high electric power requirement (and consequently a comparatively high dissipation) which may adversely affect amplifier demands. Compared to Lorentz actuators, a variable reluctance actuator would enable a improved force density while at the same time reducing (moving) mass of the actuator and the dissipation level. Known variable reluctance actuators however suffer from the drawback that an accurate force control is rendered difficult because the actuator force is strongly dependent on the relative position of the magnetic members of a variable reluctance actuator. Further, is has been observed that known variable reluctance actuators may suffer from having a comparatively high cross-talk, i.e. in addition to generating a force in a desired direction, variable reluctance actuators as known may suffer from generating disturbance forces and/or torques which render it more difficult to obtain an accurate positioning of e.g. an object table using such actuators. Such cross-talk in general depending on the relative position between a first and second member of the actuator. As such, using known variable reluctance actuators, it may be difficult to predict the actuators response when a certain magnetizing current is applied. As such, compensating for such generated disturbance forces and/or torques referred to as cross-talk may be difficult as well thereby adversely affecting the positioning accuracy that can be obtained.

SUMMARY

It is desirable to provide an electromagnetic actuator which, at least partly, overcomes one or more of the drawbacks mentioned.

According to an embodiment of the invention, there is provided an electromagnetic actuator comprising: first and second magnetic members that are displaceable relative to each other to provide a magnetic circuit; a coil configured to, in use, receive a current to generate a magnetic flux through the magnetic circuit, thereby generating a force between the first and second magnetic members in a first direction, the magnetic flux in use being transferred between the first magnetic member and the second magnetic member via an end-portion of the first magnetic member substantially parallel to the first direction, wherein a surface area of the end portion through which the magnetic flux is transferred is smaller than a facing area of the second magnetic member through which the flux is transferred.

In another embodiment, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the apparatus further comprises an actuator according to an embodiment of the invention configured to position the support or substrate table.

In another embodiment, there is provided an apparatus for imprint lithography arranged to transfer a pattern from a patterning device onto a substrate, wherein the apparatus further comprises one or more actuators according to an embodiment of the invention.

In yet another embodiment, there is provided an electromagnetic actuator comprising first and second magnetic members that are displaceable relative to each other and are arranged to provide a magnetic circuit for a magnetic flux; a coil configured to, in use, receive a current to generate the magnetic flux through the magnetic circuit, thereby generating a force between the first and second magnetic members in a first direction, the magnetic flux in use being transferred between the first and second magnetic member through a first surface of the first magnetic member and a second surface of the second magnetic member, the first and second surface being separated by an airgap; a permanent magnet arranged to provide an additional magnetic flux through the magnetic circuit, wherein the additional magnetic flux is arranged to cross the airgap separating the first magnetic member from the second magnetic member in a direction substantially parallel to the first direction.

In yet another embodiment, there is provided a device manufacturing method comprising transferring a pattern from a patterning device onto a substrate, wherein the method further comprises positioning the patterning device or the substrate using one or more actuators according to an embodiment of the invention prior to the transferring of the pattern.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
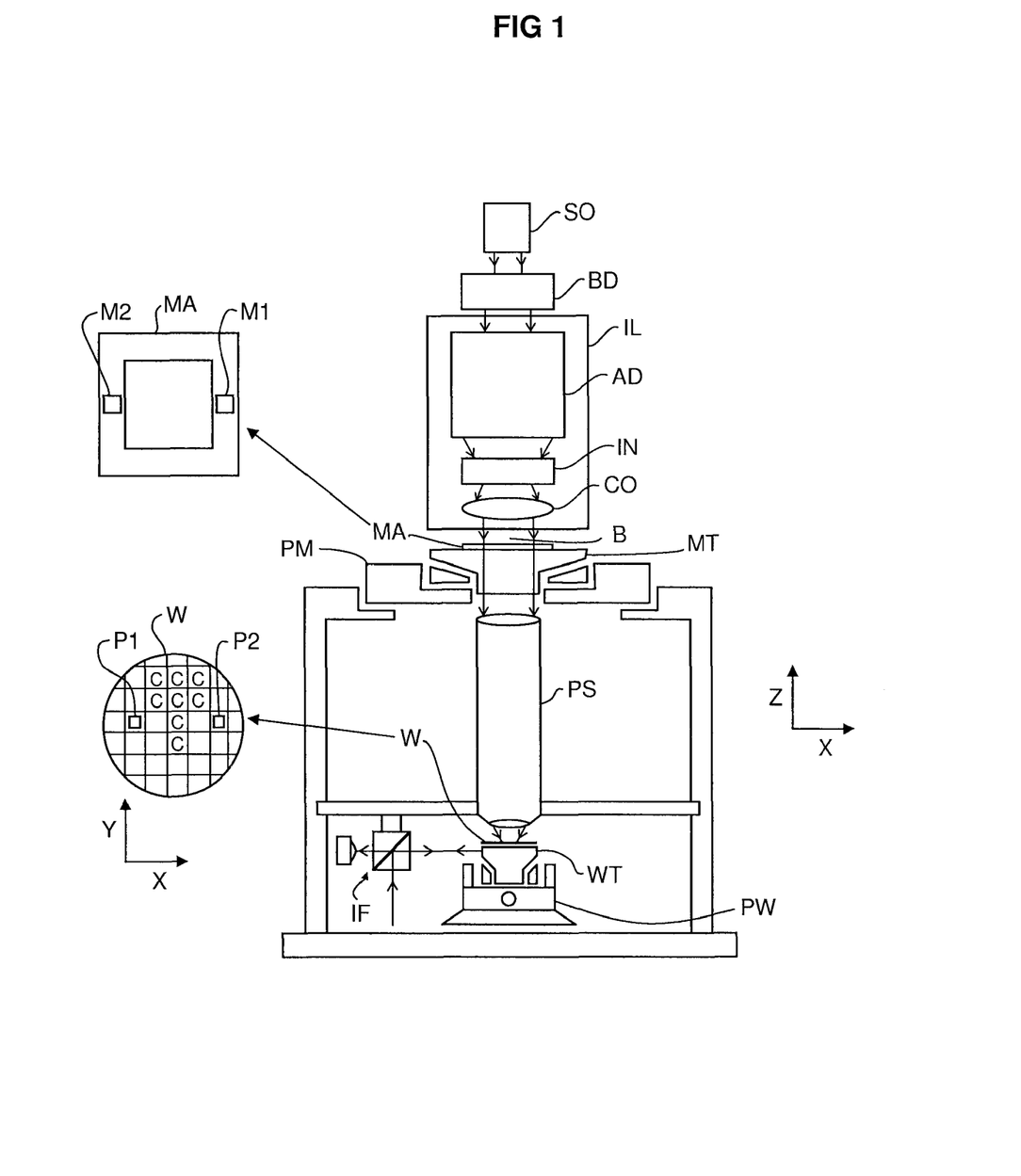
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure or patterning device support (e.g. a mask table) MT constructed to support a patterning device (e.g. a mask) MA and connected to a first positioning device PM configured to accurately position the patterning device in accordance with certain parameters. In order to accurately position the patterning device, the positioning device PM can be equipped with one or more actuators according to the invention, more details on such actuators are provided below. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Such short-stroke module may comprise one or more actuators according to the present invention. Similarly, movement of the substrate table WT or "substrate support" may be realized using a long-stroke module and a short-stroke module, e.g. comprising one or more actuators according to the present invention, the short-stroke module forming part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
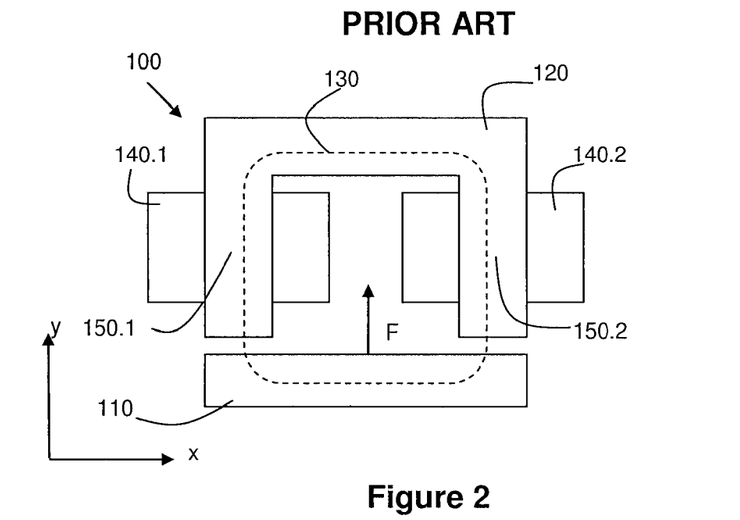
FIG. 2 schematically depicts a reluctance type actuator as known in the art.

FIG. 2 schematically depicts a conventional electromagnetic actuator 100 which can be applied for positioning purposes. The actuator as depicted comprises a first magnetic member 110, e.g. comprising a ferromagnetic material and a second magnetic member 120, e.g. comprising a ferromagnetic material, the magnetic members being arranged to form a magnetic circuit, schematically indicated by the dotted line 130. The actuator further comprises two coils 140.1 and 140.2 which are wound about legs 150.1 and 150.2 of the second magnetic member.

When, during use, the coils are energized, i.e. provided with an electric current, an attractive force, indicated by F, is generated between the first and second magnetic member. As such, using only one of such actuators is in general not suited for a bi-directional positioning in e.g. the Y-direction as indicated.

In order to obtain a bi-directional positioning of an object, e.g. a support or substrate table as described above, one could arrange a pair of such actuators on opposite sides of the object.

Figure 3:
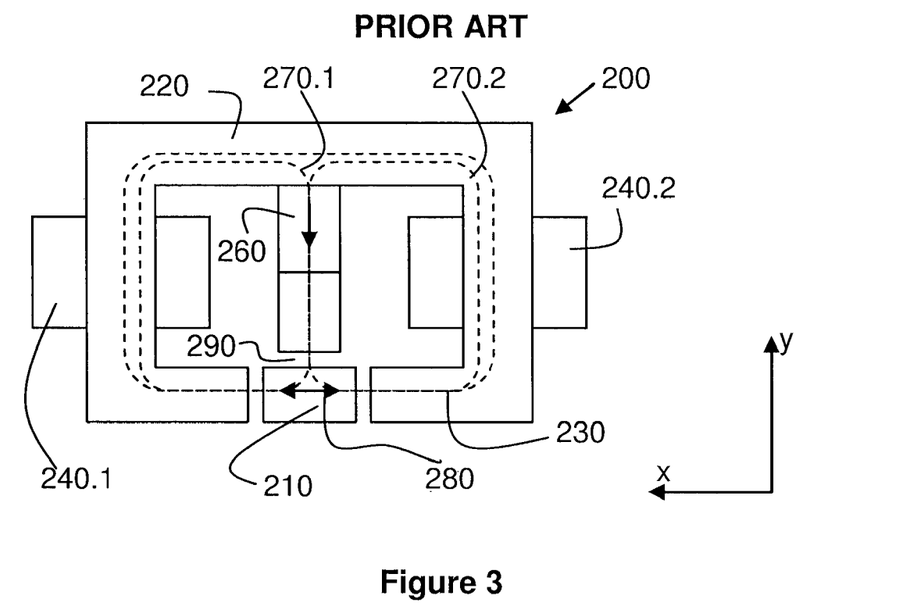
FIG. 3 schematically depicts a hybrid type actuator as known in the art.

Alternatively, a reluctance type actuator may be provided with a permanent magnet providing an additional magnetic flux through a magnetic circuit connecting the first and second member. By doing so, a bi-directional force can be generated. An example of such a reluctance actuator combined with a permanent magnet (in the following also referred to as an hybrid actuator) is schematically shown in FIG. 3. The hybrid actuator 200 as schematically shown in FIG. 3 comprises a first magnetic member 210 and a second magnetic member 220 comprising three legs whereby the middle leg is provided with a permanent magnet 260. The outer legs of the second magnetic member are provided with coils 240.1 and 240.2 configured to generate a magnetic flux in a magnetic circuit 230 connecting the first magnetic member with the second magnetic member. The permanent magnet 260 as shown provides an additional magnetic flux in the magnetic circuits 270.1 and 270.2 as schematically indicated. The arrangement as shown enables to generate a bi-directional force (indicated by the arrow 280 in FIG. 3) on the first magnetic member 210 by appropriately energizing the coils 240.1 and 240.2 of the actuator.

A drawback of the actuators as shown in FIGS. 2 and 3 is that an important cross-talk may occur. Within the meaning of this document, cross-talk is used to denote the occurrence of (parasitic) torque components or force components in a non-driving direction or a variation of such torque or force components when the first and second magnetic member are displaced relative to each other in a driving direction. The occurrence of such cross-talk may, as will be acknowledged by the skilled person, hinder an accurate position of an object using such actuators. When the first and second magnetic members are displaced relative to each other in an operating range about a nominal position, such displacement should not result in cross-talk or result in a variation of the generated force in the driving direction (e.g. the Y-direction in FIG. 2). With respect to the latter, it is worth mentioning that a reluctance type actuator or a hybrid type actuator will always, to a certain extend, have position dependent actuator force (e.g. force F as indicated in FIG. 2) in the driving direction. Further details on how such dependency can be accommodated are provided below. With respect to the hybrid actuator as schematically shown, it can further be mentioned that the actuator as shown has a further drawback in that a bias force is generated between the first and second magnetic member in a direction substantially perpendicular to the driving direction (the driving direction being the X-direction for the actuator as shown in FIG. 3). As explained in more detail below, this is due to the fact that the additional magnetic flux as generated by the permanent magnet, crosses from the first member to the second member (or vice-versa depending on the orientation of the magnet) in a direction perpendicular to the driving direction. To be specific, the additional magnetic flux generated by the permanent magnet 260 substantially crosses the airgap 290 (see FIG. 3) along the Y-direction. Further, as will be understood by the skilled person, the generated bias force may also depend on the position of the first magnetic member relative to the second magnetic member and as such contributes to the aforementioned cross-talk.

In order to mitigate one or more of the drawbacks mentioned, an embodiment of the present invention provides in an electromagnetic actuator that provides in a reduced cross-talk.

Figure 4:
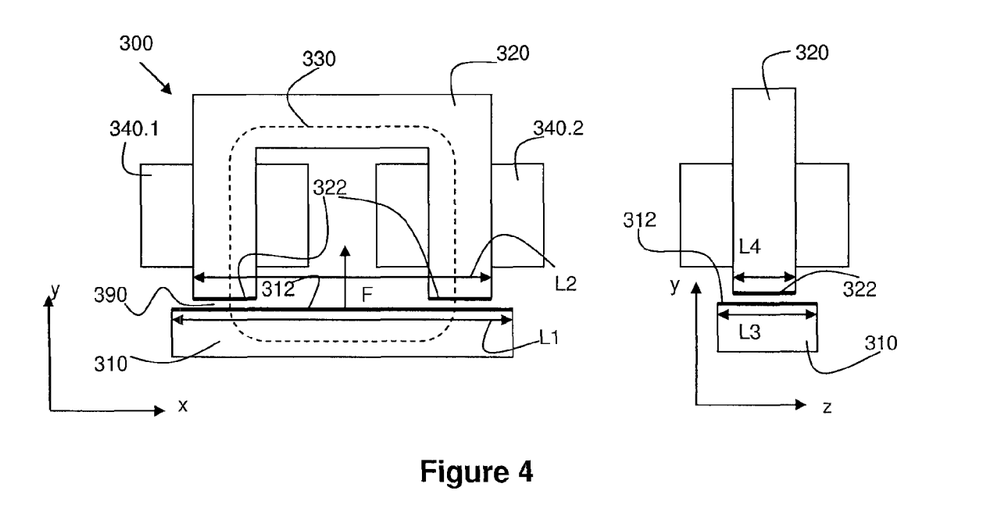
FIG. 4 schematically depicts an electromagnetic actuator according to an embodiment of the present invention.

An embodiment of such an actuator is schematically depicted in FIG. 4.

The electromagnetic actuator 300 as schematically shown in FIG. 4 is a reluctance type actuator having, similar to the actuator as shown in FIG. 2, a first magnetic member 310 and a second magnetic member 320 provided with two coils 340.1 and 340.2 wound about the second magnetic member to, in use, generate a magnetic flux through the magnetic circuit schematically indicated by the dotted line 330. Note that a single coil would also be suited to generate a magnetic flux through the circuit. Due the magnetic flux, a force F can be generated operating between the first and second magnetic member acting in a first direction (also referred to as the driving direction), being the Y-direction in the figure as shown. During use, the magnetic flux is transferred between the first and second magnetic member through a first surface 312 of the first magnetic member 310 and a second surface 322 of the second magnetic member 320, the first and second surface being separated by an airgap 390.

Figure 5:
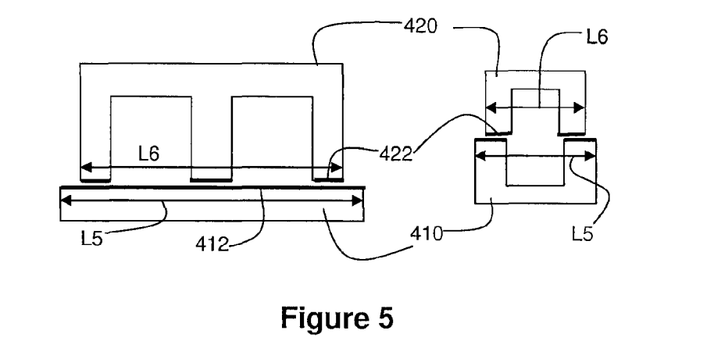
FIG. 5 schematically depicts some further arrangements of a first and second magnetic member for use in an actuator according to an embodiment of the invention.

In accordance with an embodiment of the present invention, the first surface 312 and the second surface 322 are arranged relative to each other such that an outer dimension of the first surface extends beyond an outer dimension of the second surface in a second direction substantially perpendicular to the first direction. Referring to FIG. 4, the second direction may e.g. correspond to the X-direction in which case, as can be seen, an outer dimension L1 of the first surface extends beyond an outer dimension L2 of the second surface. Alternatively or in addition, the second direction may equally correspond to the Z-direction in which case (as shown on the right in FIG. 4) an outer dimension L3 of the first surface 312 extends beyond an outer dimension L4 of the second surface 322. In accordance with an embodiment of the present invention, the outer dimension is used to denote the overall outer length or dimension of the surface or surfaces which in use contribute to the transfer of the magnetic flux from one magnetic member to the other. As such, in the embodiment shown in FIG. 4, outer dimension L2 corresponds to the outer dimension of the second magnetic member in the X-direction whereas, as can be seen, the added length of the surfaces 322 in the X-direction is smaller. In FIG. 5, some further examples are shown of actuator arrangements having a first magnetic member 410 with a first surface 412 and a second magnetic member 420 with a second surface 422, an outer dimension L5 of the first surface extends beyond an outer dimension L6 of the second surface. For clarity, the one or more energizing coils which can either be mounted to the first or second magnetic member, are not shown.

In an embodiment, the second magnetic member comprises a C-core or an E-core.

Figure 6A:
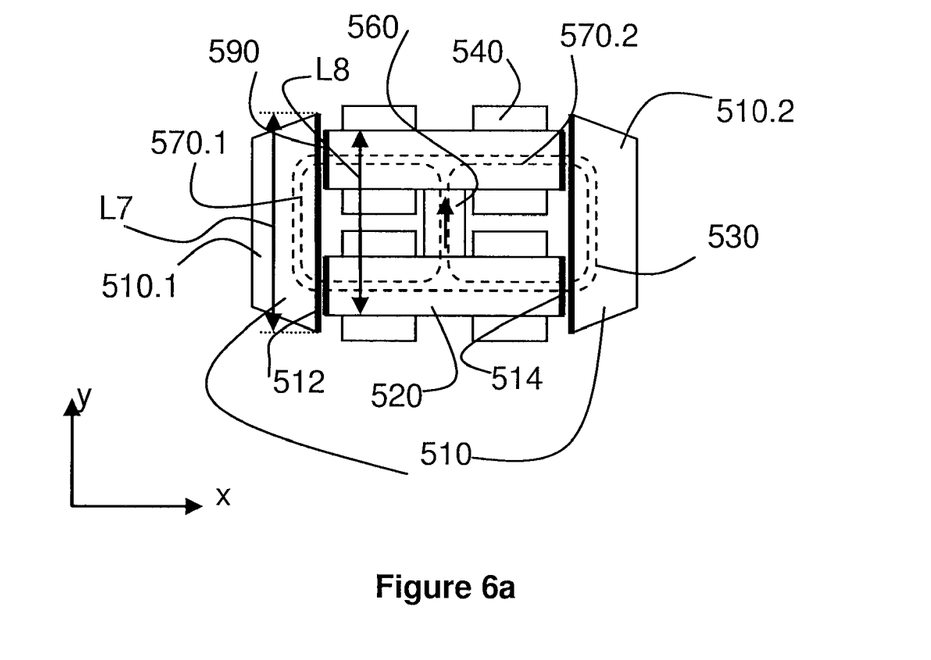
FIG. 6a schematically depicts a first hybrid electromagnetic actuator according to an embodiment of the invention.

In FIG. 6a, an embodiment of an electromagnetic actuator 500 (an hybrid type actuator) is schematically shown. Similar to the hybrid type actuator shown in FIG. 3, the actuator as shown comprises a first and second magnetic member 510, 520 forming a magnetic circuit 530 coupling the first and second magnetic member via the airgap 590. In the embodiment as shown, the first magnetic member 510 comprises a first part 510.1 and a second part 510.2, the second magnetic member 520 being arranged in between the parts of the first magnetic member. The actuator further comprises a permanent magnet 560 arranged to provide an additional magnetic flux 570.1 and 570.2. In contrast to the actuator arrangement as shown in FIG. 3, the permanent magnet 560 of the hybrid actuator according to an embodiment of the invention is arranged such that the additional magnetic flux crosses the air gap 590 separating the first magnetic member from the second magnetic member in a direction substantially parallel to the first direction (the driving direction, being the X-direction for the arrangement as shown). By doing so, the drawback of generating a bias force may, to a considerable extend, be mitigated. A further improvement of the cross-talk of the actuator as shown in FIG. 3 can be obtained by providing that a first surface 512 of the first magnetic member 510 and a second surface 522 of the second magnetic member 520 are arranged relative to each other such that an outer dimension L7 of the first surface extends beyond an outer dimension L8 of the second surface in a second direction (the Y-direction in the arrangement as shown) substantially perpendicular to the first direction. Similar to the arrangement of FIG. 3, the hybrid actuator of FIG. 6a enables bi-directional actuation by appropriately energizing one or more of the coils 540 of the actuator.

In general, in order to provide accurate positioning of an object, such as an object table in a lithographical apparatus, it is desirable to mount the actuator to the object in such manner that the actuator part comprising the actuating coils is not mounted to the object. In case of the embodiment of FIG. 6a, the first magnetic member (comprising parts 510.1 and 510.2) would thus be mounted to the object that needs positioning. In such arrangement, both magnetic parts 510.1 and 510.2 would thus be moving along with the object and the actuator would thus have to be dimensioned to accelerate or decelerate these parts as well (combined with the object). Note however that embodiments of the present invention are not restricted to a particular mounting of the actuator to an object to be displaced. As such, the second magnetic part of the actuator as shown in FIG. 6a (or the first magnetic member of the actuator as shown in FIG. 6c, see further on) may equally be mounted to the object to be displaced. Further, in such an arrangement, the position at which the force is exerted by the actuator on the object would vary, depending on the direction of the required force.

Figure 6B:
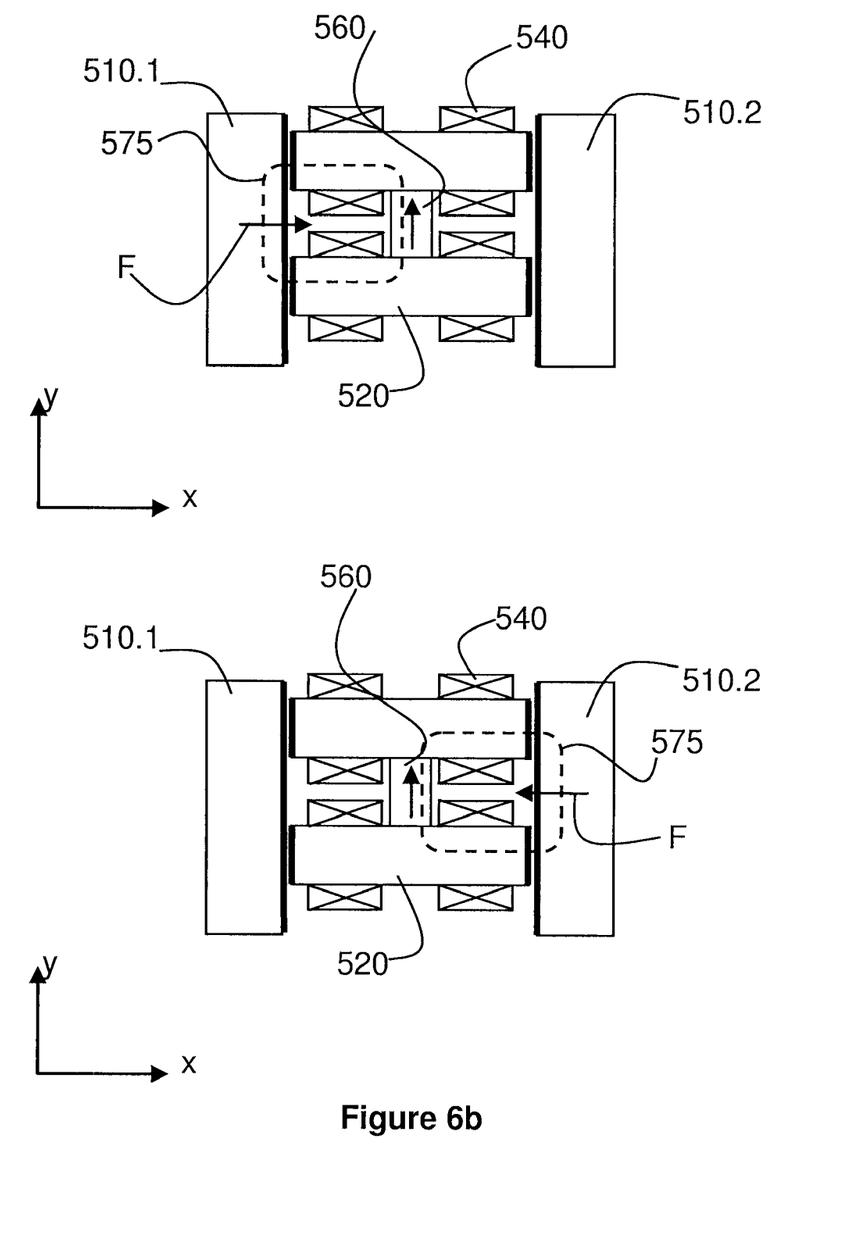
FIG. 6b schematically depicts different operating modes of the first hybrid electromagnetic actuator according to an embodiment of the invention.
Figure 6C:
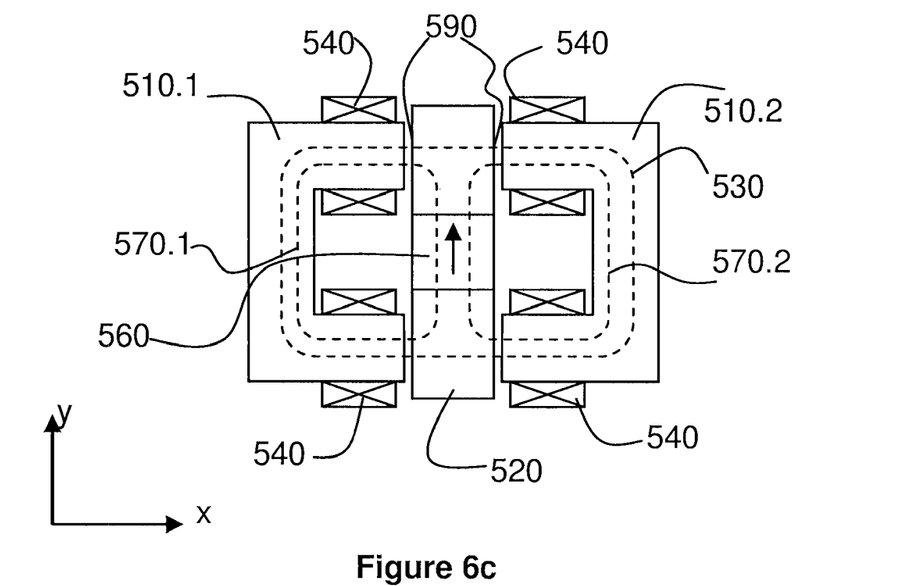
FIG. 6c schematically depicts a second hybrid electromagnetic actuator according to an embodiment of the invention.

This is illustrated in FIG. 6b, showing two operating modes of the hybrid actuator as shown in FIG. 6a. In a first operating mode, shown in the upper part of FIG. 6b, the energizing of the coils 540 is such that the resulting magnetic flux 575 generated by the energized coils and the permanent magnet 560 substantially links the second magnetic member 520 with the first part 510.1 only, resulting in an attractive force F exerted between the second magnetic member 520 and the first part 510.1. In a second operating mode, shown in the lower part of FIG. 6b, the energizing of the coils 540 is such that the resulting magnetic flux 575 generated by the energized coils and the permanent magnet 560 substantially links the second magnetic member 520 with the second part 510.2 only, resulting in an attractive force F exerted between the second magnetic member 520 and the second part 510.2. By mounting the first and second parts (510.1 and 510.2) to an object to be positioned, the force as exerted on the object would thus be applied to the object at different positions (i.e. the interfaces where the first, resp. second part are mounted to the object.

In FIG. 6c, a second embodiment of an hybrid type actuator is schematically shown. In this embodiment, the actuating coils 540 that are used to direct the resulting magnetic flux to either the first or second part of the first magnetic member are mounted to the first and second part of the first magnetic member, instead of being mounted to the second magnetic part. In the embodiment as shown, the actuator comprises a first magnetic member comprising a first part 510.1 and a second part 510.2 (which can e.g. be C-cores as shown or E-cores) and a second magnetic member 520 provided in between the first part and the second part of the first magnetic member, thus forming (in a similar manner as in the actuator of FIG. 6a) a magnetic circuit magnetically coupling the first magnetic member with the second magnetic member via the airgap 590. The actuator further comprises a permanent magnet 560 arranged to provide an additional magnetic flux 570.1 and 570.2, similar to the arrangement of FIG. 6a. Equally, the permanent magnet 560 of the hybrid actuator as shown in FIG. 6c is arranged such that the additional magnetic flux crosses the air gap 590 separating the first magnetic member from the second magnetic member in a direction substantially parallel to the first direction (the driving direction, being the X-direction for the arrangement as shown). By doing so, the drawback of generating a bias force may, to a considerable extend, be mitigated. In the arrangement of FIG. 6c, actuating coils 540 are provided on the first and second part (510.1 and 510.2) of the first magnetic member, compared to the coils being arranged on the second magnetic member 520 in FIG. 6a. As can be seen, each of the first and second part 510.1 and 510.2 is provided with a pair of coils for controlling the magnetic flux coupling the first and second magnetic member. Note that a single coil (instead of the pair of coils) may also be applied to obtain the same functionality. Similar to the arrangements of FIG. 3 or FIG. 6a, the hybrid actuator of FIG. 6c thus enables bi-directional actuation by appropriately energizing the coils 540 of the actuator. Because in the arrangement of FIG. 6c the coils are mounted to the first magnetic member, it may be beneficial to mount the second magnetic member 520 to an object to be positioned.

With respect to the hybrid type actuators as shown in FIGS. 6a-6c, the following benefits may be emphasized:

- In an embodiment, substantially the entire magnetic flux crosses the airgap (or airgaps) between the first magnetic part and the second magnetic part in the moving direction (or force direction), i.e. the first direction thus mitigating or avoiding parasitic forces occurring in other directions.
- The magnetic flux generated by the permanent magnet or magnets can be considered a parallel circuit which coincides with the magnetic flux generated by the coils, such that both flux contributions are added when crossing the air gap.
- In an embodiment, the magnetic flux path as seen by the coils has a substantially constant magnetic resistance, leading to a substantially constant self inductance of the coils (i.e. substantially independent to the position of the first magnetic part relative to the second magnetic part), which is beneficial to the control loop of an amplifier powering the coils as it enables a substantially constant gain.

In general, the weight of this second magnetic member 520 will be smaller than the combined weight of the first and second parts 510.1 and 510.2 of the actuator shown in FIG. 6a, thus reducing the required actuator forces for providing a desired acceleration or deceleration to an object such as an object table.

Figure 6D:
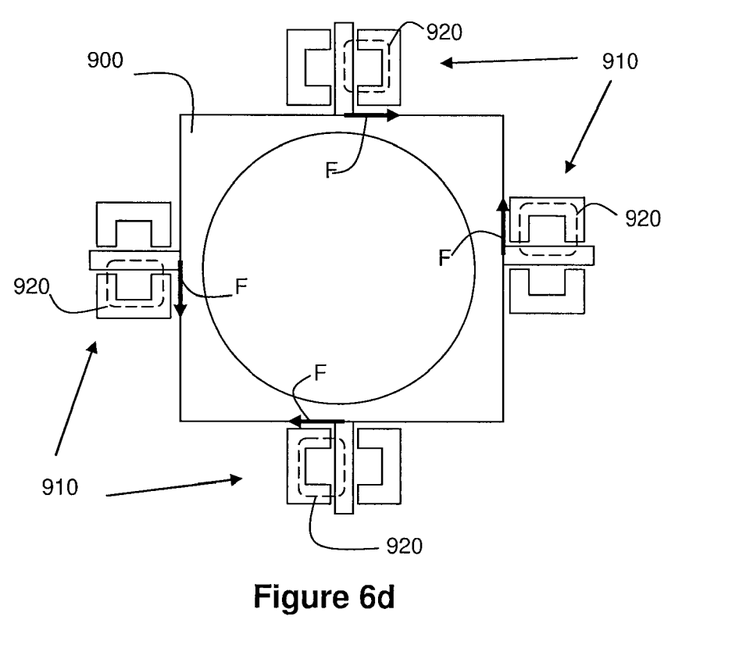
FIG. 6d schematically depicts a top view of an object table and 4 hybrid actuators according to the second embodiment.

Further, by mounting the second magnetic member 520 to the object to be positioned, the force as exerted on the object would thus be applied to the object at the same position (i.e. at the interface where the second magnetic member is mounted to the object), thus avoiding deformations or distortions of the object table or object table position, this is illustrated in FIG. 6d.

In FIG. 6d, a top view of an object table 900 is schematically shown combined with four actuators 910 of the type as shown in FIG. 6c. Note that for clarity, only the outlines of the first magnetic members and second magnetic members of the actuators are shown, the coils and permanent magnets are not shown. For each of the actuators, the resulting magnetic flux 920 coupling the first magnetic member to the second magnetic member is schematically shown, together with the actuator force F experienced by the second magnetic member and exerted on the object table. As can be seen, regardless of the direction of the generated force F, the force is offered or exerted on the object table in substantially the same position, i.e. where the second magnetic member is connected to the object table. In an embodiment (not shown), a plurality of actuators can be used to drive the corresponding axes.

In an actuator according to an embodiment of the invention, a projection of second surface (e.g. surface 312 or 512) onto the first surface (e.g. surface 322 or 522) in the first direction, i.e. the driving direction, remains within an outer contour of the first surface area for each position of the first magnetic member relative to the second magnetic member within an operating range of the actuator. As such, in the embodiment, the dimensioning of the first and second magnetic member is such that, for each operating point within the operating range of the actuator, an outer dimension (e.g. L1, L3, L7) of a first surface of the first magnetic member extends beyond an outer dimension (e.g. L2, L4, L8 resp.) of a second surface in a second direction. The operating range of the actuator can e.g. be described by a volume ($\Delta x$ by $\Delta y$ by $\Delta z$) about a nominal working point. By ensuring that the dimensioning of the first and second magnetic member is such that, for each operating point within the operating range of the actuator, the outer dimension of the first surface of the first magnetic member extends beyond the outer dimension of the second surface in a second direction, a mitigation of the cross-talk can be realized.

In an embodiment, the outer dimension of the first surface of the first magnetic member also extends beyond the outer dimension of the second surface in a third direction, substantially perpendicular to both the first and second direction.

In an embodiment, the dimensioning of the first and second magnetic member is such that the first surface extends beyond the second surface by a length larger or equal to a nominal value of the airgap between both members. As such, assuming the second surface has an outer area of n by m, the first surface may thus have at least an outer area of (n+$\delta$) by (m+$\delta$), $\delta$ being the nominal airgap length between the first and second magnetic member. When the electromagnetic actuator is applied within a comparatively small operating range, e.g. $\Delta x$, $\Delta y$, $\Delta z<\delta$, an important reduction in the cross-talk can be observed. In case the operating range in a direction substantially perpendicular to the driving direction is comparatively large, it may be required to increase the outer area of the first surface even further.

Figure 7:
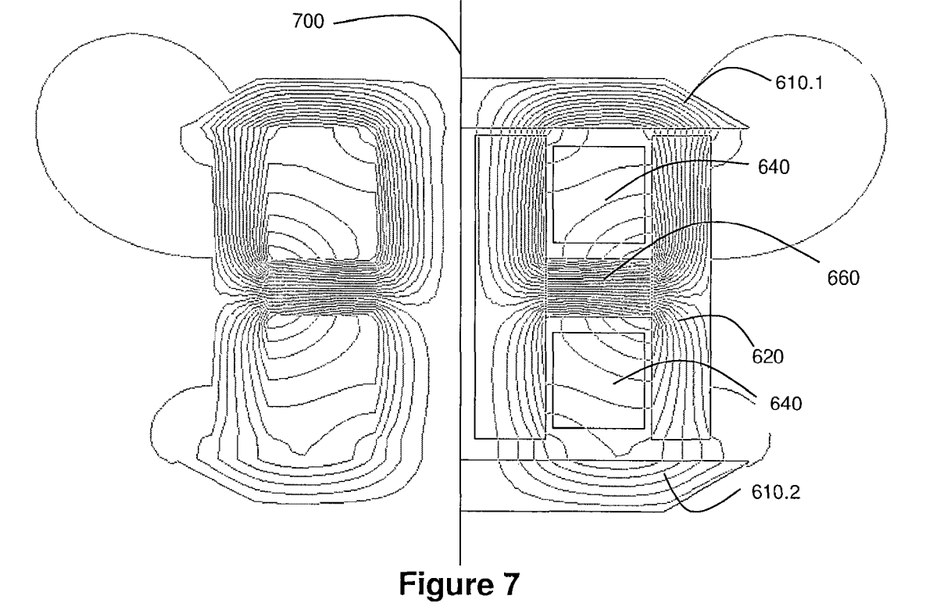
FIG. 7 schematically depicts a magnetic field simulation of an electromagnetic actuator according to an embodiment of the invention.

In an embodiment, the actuator (either the reluctance type actuator of FIGS. 4 and 5 or the hybrid type actuator of FIG. 6a or 6c) is rotationally symmetric, whereby the symmetry-axis is substantially parallel to the driving axis, i.e. the axis parallel to the driving direction. Such an arrangement is schematically shown in FIG. 7 whereby 700 represents the symmetry-axis. In FIG. 7, a simulation of the magnetic flux through the permanent magnet 660 and the first 610.1, 610.2 and second 620 magnetic members is further shown. The electromagnetic force generated between the first and second magnetic member can be controlled by supplying a current to one of the coils 640 of the actuator. In such a rotationally symmetrical design, it may be preferred to use a sintered magnetic material instead of using a laminated material, because a laminated material is not easily applied in a rotational symmetric design.

In an embodiment, one or more of the actuators are applied in a stage apparatus for positioning an object, the stage apparatus comprising a table configured to mount the object. In such embodiment, the first magnetic members of the one or more actuators may be mounted to the table.

With respect to the electromechanical properties of the actuators according to an embodiment of the invention, the following aspects are worth noting:
- both actuator types according to an embodiment of the invention provide a high force-to-mass ratio, in particular with respect to the mass of the first magnetic member, this member in general being mounted to the object that is to be displaced, whereas the energizing coils are preferably mounted to the second magnetic member.
- the reluctance type actuator is further characterized as providing a low signal to noise ratio and provides a zero stiffness when no currents are supplied to the coil or coils of the actuator.
- the hybrid type actuator provides, as mentioned, a bi-directional force enabling to control the actuator by a single power amplifier.
- further benefits that are worth mentioning are a low hysteresis and a substantially constant inductance. The latter is particularly beneficial because the actuator is thus perceived by a power amplifier supplying the coils as a substantially constant load. The hybrid actuator is further characterized as having a substantially linear force vs. current characteristic.

In order to enable an even more accurate force control (and thus position control) of an object such as a patterning device or a substrate in a lithographic apparatus, the actuator according to an embodiment of the invention may further be provided with a measurement coil for generating a measurement signal representative of the magnetic flux through the magnetic circuit, whereby the measurement coil is arranged to substantially enclose the magnetic flux through the magnetic circuit. In this respect, reference is made to U.S. Provisional Application Ser. No. 61/362,887, incorporated herein by reference in its entirety.

In such arrangement, the actuator may further comprise a control unit arranged to receive the measurement signal and provide a control signal based on the measurement signal at an output terminal to control an amplitude of a current of a coil of the actuator or to control an amplitude of a current of a coil of a further actuator.

Figure 8:
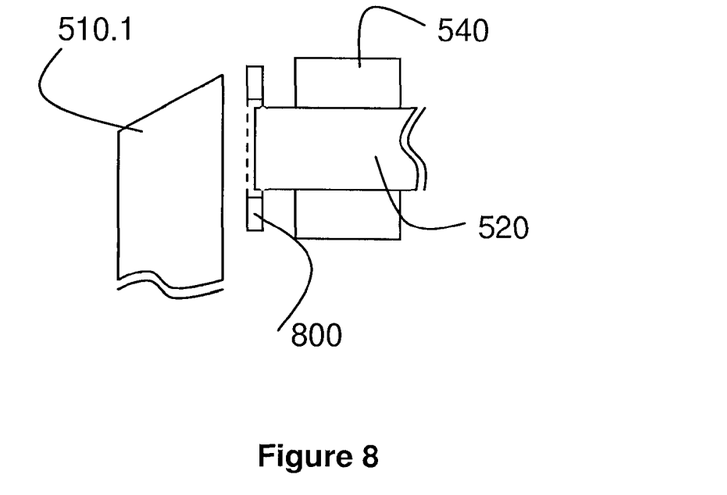
FIG. 8 schematically depicts a detail of an actuator according to an embodiment of the invention, including a measurement coil.

As described in more detail in U.S. Provisional Application Ser. No. 61/362,887, the measurement coil is preferably, at least partly, arranged in an airgap separating the first magnetic member and the second magnetic member. In FIG. 8, a detail of the actuator of FIG. 6a is shown, further showing a possible position of the measurement coil 800. In the arrangement as shown, the measurement coil 800 may be a coil that is partly wound about the magnetic member 520 and mounted to the member.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. An electromagnetic actuator comprising:
    first and second magnetic members that are displaceable relative to each other and are arranged to provide a magnetic circuit; and
    a coil configured to, in use, receive current to generate a magnetic flux through the magnetic circuit, thereby generating a force between the first and second magnetic members in a first direction,
    the magnetic flux, in use, being transferred between the first and second magnetic members through a first surface of the first magnetic member and a second surface of the second magnetic member, the first and second surface being separated by an airgap,
    wherein the first surface and the second surface are arranged relative to each other such that an outer dimension of the first surface extends beyond an outer dimension of the second surface in a second direction substantially perpendicular to the first direction and wherein, in use, a projection of the second surface onto the first surface in the first direction remains within an outer contour of the first surface for each position of the first magnetic member relative to the second magnetic member within an operating range of the actuator.

2. An electromagnetic actuator comprising:
    first and second magnetic members that are displaceable relative to each other and are arranged to provide a magnetic circuit;
    a coil configured to, in use, receive a current to generate a magnetic flux through the magnetic circuit, thereby generating a force between the first and second magnetic members in a first direction,
    the magnetic flux, in use, being transferred between the first and second magnetic members through a first surface of the first magnetic member and a second surface of the second magnetic member, the first and second surface being separated by an airgap; and
    a permanent magnet arranged to provide an additional magnetic flux through the magnetic circuit, wherein the additional magnetic flux is arranged to cross the airgap separating the first magnetic member from the second magnetic member in a direction substantially parallel to the first direction.

3. The electromagnetic actuator according to claim 1, wherein the coil is wound about a leg of the second magnetic member.

4. The electromagnetic actuator according to claim 1, wherein the second surface has an outer area of n by m, and the first surface has at least an (n+δ) by (m+δ) outer area, δ being the nominal airgap length between the first and second magnetic member.

5. The electromagnetic actuator according to claim 1, further comprising a permanent magnet arranged to provide an additional magnetic flux through the magnetic circuit.

6. The electromagnetic actuator according to claim 5, wherein the permanent magnet is part of the second magnetic member.

7. The electromagnetic actuator according to claim 5, wherein the additional magnetic flux is arranged to cross the airgap separating the first magnetic member from the second magnetic member in a direction substantially parallel to the first direction.

8. The electromagnetic actuator according to claim 5, wherein the first magnetic member comprises a first part and a second part, the second magnetic member being arranged between the first and second part.

9. The electromagnetic actuator according to claim 1, wherein the actuator is rotationally symmetrical about an axis substantially parallel to the first direction.

10. The electromagnetic actuator according to claim 1, wherein the first surface and the second surface are arranged relative to each other such that an outer dimension of the first surface extends beyond an outer dimension of the second surface in a third direction substantially perpendicular to the first direction and the second direction.

11. The electromagnetic actuator according to claim 1, further comprising a measurement coil configured to generate a measurement signal representative of the magnetic flux through the magnetic circuit, wherein the measurement coil is arranged to substantially enclose the magnetic flux through the magnetic circuit.

12. A stage apparatus configured to position an object, the stage apparatus comprising: a table configured to hold the object; and one or more actuators according to claim 1 to position the table, wherein the first magnetic members of the one or more actuators are mounted to the table.

13. A lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate, and an actuator according to claim 1 configured to position the support or the substrate table.

14. An apparatus for imprint lithography arranged to transfer a pattern from a patterning device onto a substrate, the apparatus comprising one or more actuators according to claim 1.

15. A device manufacturing method comprising:

transferring a pattern from a patterning device onto a substrate; and positioning the patterning device or the substrate using one or more actuators according to claim 1.

* * * * *